(12) United States Patent
Ishii et al.

(10) Patent No.: US 11,139,160 B2
(45) Date of Patent: Oct. 5, 2021

(54) APPARATUS AND METHOD FOR PROCESSING A SURFACE OF A SUBSTRATE

(71) Applicant: EBARA CORPORATION, Tokyo (JP)

(72) Inventors: Yu Ishii, Tokyo (JP); Keisuke Uchiyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 518 days.

(21) Appl. No.: 16/184,694

(22) Filed: Nov. 8, 2018

(65) Prior Publication Data

US 2019/0148125 A1    May 16, 2019

(30) Foreign Application Priority Data

Nov. 13, 2017    (JP) .............................. JP2017-217906

(51) Int. Cl.
  *B24B 1/00*      (2006.01)
  *B24B 41/06*     (2012.01)
  (Continued)

(52) U.S. Cl.
  CPC ............ *H01L 21/0209* (2013.01); *B24B 1/00* (2013.01); *B24B 9/065* (2013.01); *B24B 21/004* (2013.01);
  (Continued)

(58) Field of Classification Search
  CPC ........... H01L 21/0209; H01L 21/67046; H01L 21/68728; H01L 21/6838; B24B 21/06;
  (Continued)

(56) References Cited

U.S. PATENT DOCUMENTS 4,945,683 A * 8/1990 Phillips ................... B24B 19/12
                                                      451/251
5,224,300 A * 7/1993 Pineau .................. B24B 21/004
                                                      451/168
(Continued)

FOREIGN PATENT DOCUMENTS

JP    S61-203643 A    9/1986
JP    H08-010721 A    1/1996
(Continued)

OTHER PUBLICATIONS

European Patent Application No. 18205424.7; Extended Search Report; dated Apr. 17, 2019; 7 pages.

*Primary Examiner* — Joseph J Hail
*Assistant Examiner* — Arman Milanian
(74) *Attorney, Agent, or Firm* — BakerHostetler

(57) ABSTRACT

An apparatus and a method which can perform different processes, such as polishing and cleaning, on a surface of a substrate, such as a wafer, with a single processing head, and can process the surface of the substrate efficiently are disclosed. The apparatus includes: a substrate holder configured to hold a substrate and rotate the substrate; and a processing head configured to bring scrubbing tapes into contact with a first surface of the substrate to process the first surface. The processing head includes: pressing members arranged to press the scrubbing tapes against the first surface of the substrate; position switching devices configured to be able to switch positions of the pressing members between processing positions and retreat positions; tape feeding reels (Continued)

configured to feed the scrubbing tapes, respectively; and tape take-up reels configured to take up the scrubbing tapes, respectively.

14 Claims, 12 Drawing Sheets

(51) Int. Cl.
| | |
|---|---|
| *H01L 21/02* | (2006.01) |
| *B24B 21/06* | (2006.01) |
| *H01L 21/67* | (2006.01) |
| *B24B 37/10* | (2012.01) |
| *B24B 21/00* | (2006.01) |
| *B24B 9/06* | (2006.01) |
| *H01L 21/683* | (2006.01) |
| *H01L 21/687* | (2006.01) |

(52) U.S. Cl.
CPC ............ *B24B 21/06* (2013.01); *B24B 37/105* (2013.01); *B24B 41/06* (2013.01); *H01L 21/67046* (2013.01); *H01L 21/6838* (2013.01); *H01L 21/68728* (2013.01)

(58) Field of Classification Search
CPC ..... B24B 21/004; B24B 37/105; B24B 9/065; B24B 41/06; B24B 1/00; B24D 11/04
USPC ............. 15/97.1; 438/690, 906; 451/173, 41
See application file for complete search history.

(56) References Cited

U.S. PATENT DOCUMENTS

| | | | | |
|---|---|---|---|---|
| 5,251,404 | A * | 10/1993 | Wasserbaech | ............ B24B 5/42 |
| | | | | 451/303 |
| 7,278,903 | B2 | 10/2007 | Masuda | |
| 9,559,021 | B2 * | 1/2017 | Lee | ......... H01L 22/20 |
| 2001/0011002 | A1* | 8/2001 | Steere, III | ............. B24D 11/04 |
| | | | | 451/168 |
| 2002/0045348 | A1 | 4/2002 | Arai et al. | |
| 2004/0106363 | A1 | 6/2004 | Ishii et al. | |
| 2013/0074873 | A1* | 3/2013 | Kitagawa | .......... H01L 21/67028 |
| | | | | 134/6 |
| 2013/0213437 | A1 | 8/2013 | Ishii et al. | |
| 2014/0206262 | A1* | 7/2014 | Oono | ...................... B24B 9/065 |
| | | | | 451/44 |
| 2014/0220866 | A1* | 8/2014 | Ishii | ........................ B24B 7/228 |
| | | | | 451/41 |
| 2015/0000055 | A1* | 1/2015 | Togawa | .................. B08B 1/006 |
| | | | | 15/97.1 |

FOREIGN PATENT DOCUMENTS

| | | |
|---|---|---|
| JP | 2003-022992 A | 1/2003 |
| JP | 2008-210894 A | 9/2008 |
| JP | 2014-063955 A | 4/2014 |
| JP | 2015-012200 A | 1/2015 |
| JP | 2017-188695 A | 10/2017 |

* cited by examiner

APPARATUS AND METHOD FOR PROCESSING A SURFACE OF A SUBSTRATE

CROSS REFERENCE TO RELATED APPLICATION

This document claims priority to Japanese Patent Application Number 2017-217906 filed Nov. 13, 2017, the entire contents of which are hereby incorporated by reference.

BACKGROUND

Devices, such as memory circuits, logic circuits and image sensors (e.g. CMOS sensors) are becoming more highly integrated these days. In a process for forming such devices, foreign matter such as fine particles and dust may adhere to the devices. Foreign matter adhering to a device can cause a short-circuit between interconnects or can cause a circuit defect. Therefore, in order to enhance the reliability of the device, it is necessary to clean a wafer on which the device is formed to remove the foreign matter on the wafer.

The above-described foreign matter, such as fine particles and dust, can may adhere also to a back surface (or a non-device surface) of a wafer with its front surface covered with photoresist. If such foreign matter adheres to the back surface of the wafer, the wafer can separate from or become inclined with respect to a stage reference surface of an exposure apparatus in an exposure process that is performed after the photoresist has been applied to the wafer. As a result, patterning shift or focal distance shift can occur. In order to prevent such problems, it is necessary to remove the foreign matter adhering to the back surface of the wafer.

A patterning device, which uses nanoimprint technology instead of optical exposure technology, has recently been developed. The nanoimprint technology involves pressing a patterning mold against a resin material that has been applied to a wafer, thereby transferring an interconnect pattern to the resin material. In order to avoid transfer of a contaminant between a die and a wafer or between wafers in such a nanoimprint process, it is necessary to remove foreign matter present on a surface of a wafer. In view of this, an apparatus has been proposed which rubs a polishing tool against a wafer under high load while supporting a lower side of the wafer with a high-pressure fluid, thereby slightly scraping away the surface of the wafer.

A conventional apparatus performs polishing of a wafer surface while rotating the wafer by using a substrate rotating mechanism (see, for example, Japanese Laid-open Patent Publication No. 2015-12200). The substrate rotating mechanism includes a plurality of chucks for gripping the periphery of the wafer, and an annular hollow motor for rotating the wafer through the chucks. The wafer is held horizontally by the chucks, and is rotated about its axis, along with the chucks, by the hollow motor. A processing head provided with a polishing tool is disposed inwardly of the periphery of the wafer held by the chucks so that the processing head will not contact the rotating chucks. As a result, an outermost area of the wafer surface cannot be polished, and needs to be polished separately by using an edge polishing unit.

Further, it is necessary to transfer the wafer from the edge polishing unit to the center polishing unit, or from the center polishing unit to the edge polishing unit, and particles in the air may adhere to the wafer when the wafer is transferred between the units.

In the conventional apparatus, a plurality of processing tools are provided inside the processing head. These processing tools simultaneously contact a substrate to process the substrate. With this arrangement, when rough polishing and finish polishing are to be performed separately using the processing head, it is necessary to replace the processing tools of the processing head. As a result, it takes a certain time to perform a series of processes, such as rough polishing and finish polishing, with the processing head.

Further, in such a case, it is possible to configure the unit such that a desired process is carried out by dividing it into units such as a unit for performing rough polishing and a unit for performing finish polishing in the processing unit. However, with such a configuration, for example, it is still necessary to transfer a substrate from the unit for rough polishing to the unit for finish polishing, and it takes time to perform a series of processes.

SUMMARY OF THE INVENTION

According to embodiments, there are provided an apparatus and a method which can perform different processes, such as polishing and cleaning, on a surface of a substrate, such as a wafer, with a single processing head, and can process the surface of the substrate efficiently.

Embodiments, which will be described below, relate to an apparatus and a method for processing a surface of a substrate, such as a wafer.

In an embodiment, there is provided a substrate processing apparatus comprising: a substrate holder configured to hold a substrate and rotate the substrate; and a processing head configured to bring scrubbing tapes into contact with a first surface of the substrate to process the first surface, wherein the processing head includes: pressing members arranged to press the scrubbing tapes against the first surface of the substrate; position switching devices configured to be able to switch positions of the pressing members between processing positions and retreat positions; tape feeding reels configured to feed the scrubbing tapes, respectively; and tape take-up reels configured to take up the scrubbing tapes, respectively.

In an embodiment, each of the scrubbing tapes comprises one of a rough polishing tape having abrasive grains on a surface thereof, a finish polishing tape having abrasive grains on a surface thereof, and a cleaning tape having no abrasive grains.

In an embodiment, the position switching devices comprise actuators configured to move the pressing members, respectively.

In an embodiment, the substrate holder includes: a vacuum suction stage configured to attract a second surface of the substrate by vacuum suction to hold the second surface, the second surface being an opposite side of the substrate from the first surface; and a stage motor configured to rotate the vacuum suction stage.

In an embodiment, the substrate holder includes rollers arranged to be able to contact a periphery of the substrate, the rollers being rotatable about their own axes.

In an embodiment, the substrate holder further includes a hydrostatic support stage configured to support a second surface of the substrate, the second surface being an opposite side of the substrate from the first surface.

In an embodiment, the rollers have substrate holding surfaces, respectively, which can contact the periphery of the substrate, and at least one of the substrate holding surfaces is different in height from other substrate holding surfaces.

In an embodiment, there is provided a substrate processing method comprising: rotating a substrate while holding the substrate with a substrate holder; and pressing a first scrubbing tape or a second scrubbing tape by a processing head against a first surface of the substrate to process an entirety of the first surface, the processing head having the first scrubbing tape and the second scrubbing tape, wherein processing the entirety of the first surface of the substrate comprises: placing the second scrubbing tape at a retreat position and placing the first scrubbing tape at a processing position; pressing the first scrubbing tape against the first surface of the substrate to perform a first process on the entirety of the first surface of the substrate; placing the first scrubbing tape at a retreat position and placing the second scrubbing tape at a processing position; and pressing the second scrubbing tape against the first surface of the substrate to perform a second process on the entirety of the first surface of the substrate.

In an embodiment, the first scrubbing tape comprises a rough polishing tape having abrasive grains on a surface thereof; pressing the first scrubbing tape against the first surface of the substrate to perform the first process on the entirety of the first surface of the substrate comprises pressing the rough polishing tape against the first surface of the substrate to rough-polish the entirety of the first surface of the substrate; the second scrubbing tape comprises a finish polishing tape having abrasive grains on a surface thereof; and pressing the second scrubbing tape against the first surface of the substrate to perform the second process on the entirety of the first surface of the substrate comprises pressing the finish polishing tape against the first surface of the substrate to finish-polish the entirety of the first surface of the substrate.

In an embodiment, the first scrubbing tape comprises a polishing tape having abrasive grains on a surface thereof; pressing the first scrubbing tape against the first surface of the substrate to perform the first process on the entirety of the first surface of the substrate comprises pressing the polishing tape against the first surface of the substrate to polish the entirety of the first surface of the substrate; the second scrubbing tape comprises a cleaning tape having no abrasive grains; and pressing the second scrubbing tape against the first surface of the substrate to perform the second process on the entirety of the first surface of the substrate comprises pressing the cleaning tape against the first surface of the substrate to clean the entirety of the first surface of the substrate.

In an embodiment, there is provided a substrate processing method comprising: rotating a substrate by rotating rollers about their own axes while placing the rollers in contact with a periphery of the substrate; and pressing a rough polishing tool or a finish polishing tool by a processing head against a back surface of the substrate to process an entirety of the back surface, the processing head having the rough polishing tool and the finish polishing tool, wherein processing the entirety of the back surface of the substrate comprises: placing the finish polishing tool at a retreat position and placing the rough polishing tool at a processing position; pressing the rough polishing tool against the back surface of the substrate to rough-polish the entirety of the back surface of the substrate; placing the rough polishing tool at a retreat position and placing the finish polishing tool at a processing position; and pressing the finish polishing tool against the back surface of the substrate to finish-polish the entirety of the back surface of the substrate.

In an embodiment, the rough polishing tool comprises a rough polishing tape having abrasive grains on a surface thereof, and the finish polishing tool comprises a finish polishing tape having abrasive grains on a surface thereof.

In an embodiment, the polishing of the entirety of the back surface of the substrate is performed after a photoresist has been applied to a surface of the substrate and before an exposure is performed on the substrate with the photoresist applied.

In an embodiment, finish-polishing the entirety of the back surface of the substrate comprises: moving the rough polishing tool from a processing position to a retreat position and moving the finish polishing tool from a retreat position to a processing position after the entirety of the back surface of the substrate is rough-polished; and pressing the finish polishing tool against the back surface of the substrate to finish-polish the entirety of the back surface of the substrate.

In an embodiment, there is provided a substrate processing method comprising: rotating a substrate by rotating rollers about their own axes while placing the rollers in contact with a periphery of the substrate; and pressing a polishing tool or a cleaning tool by a processing head against a back surface of the substrate to process an entirety of the back surface, the processing head having the polishing tool and the cleaning tool, wherein processing the entirety of the back surface of the substrate comprises: placing the cleaning tool at a retreat position and placing the polishing tool at a processing position; pressing the polishing tool against the back surface of the substrate to polish the entirety of the back surface of the substrate; placing the polishing tool at a retreat position and placing the cleaning tool at a processing position; and pressing the cleaning tool against the back surface of the substrate to clean the entirety of the back surface of the substrate.

In an embodiment, the polishing tool comprises a polishing tape having abrasive grains on a surface thereof, and the cleaning tool comprises a cleaning tape having no abrasive grains.

In an embodiment, the processing of the entirety of the back surface of the substrate is performed after a photoresist has been applied to a surface of the substrate and before an exposure is performed on the substrate with the photoresist applied.

In an embodiment, cleaning the entirety of the back surface of the substrate comprises: moving the polishing tool from a processing position to a retreat position and moving the cleaning tool from a retreat position to a processing position after the entirety of the back surface of the substrate is polished; and pressing the cleaning tool against the back surface of the substrate to clean the entirety of the back surface of the substrate.

According to the above-described embodiments, the position switching devices can switch the positions of the pressing members between the processing positions and the retreat positions. Therefore, with use of different types of scrubbing tapes (or processing tools), the substrate processing apparatus can perform different processes, such as polishing and cleaning, on the surface of the substrate with one processing head. As a result, a time of series of processes, such as polishing and cleaning, can be shortened, and the substrate can be processed efficiently. Further, the substrate processing apparatus, including the vacuum suction stage or the rollers, enables the processing tools to contact the surface of the substrate ranging from the center to the outermost region thereof when the substrate is rotating. Accordingly, the processing tools can process the entirety of the surface of the substrate.

DESCRIPTION OF EMBODIMENTS

Embodiments will now be described with reference to the drawings.

Figure 1:
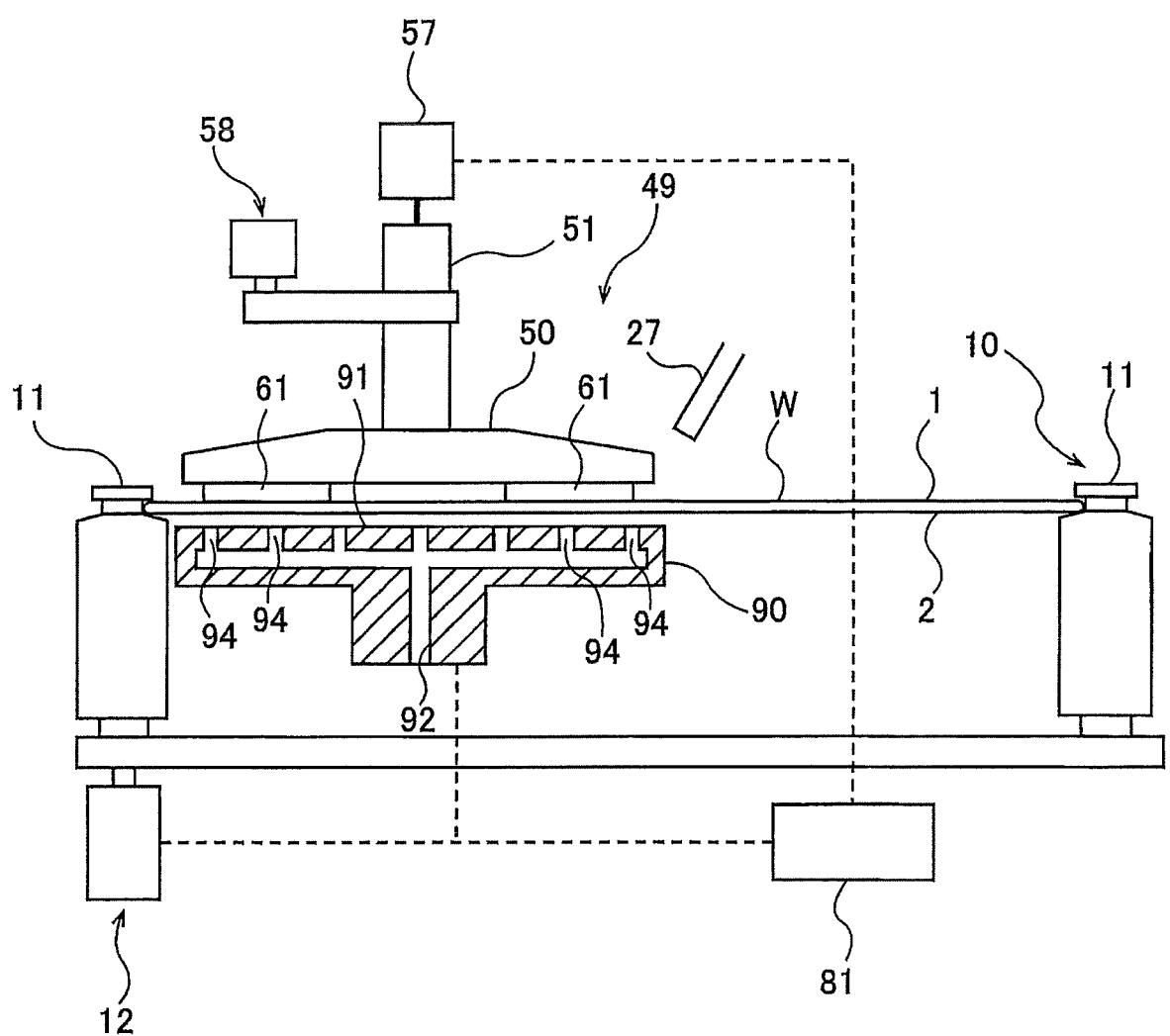
FIG. 1 is a schematic view showing an embodiment of a substrate processing apparatus.

FIG. 1 is a schematic view showing an embodiment of a substrate processing apparatus. The substrate processing apparatus includes a substrate holder 10 for holding a wafer W, which is an example of a substrate, and rotating the wafer W about its axis, a processing head assembly 49 for processing a first surface 1 of the wafer W, held by the substrate holder 10, to remove foreign matter, scratches, etc. from the first surface 1 of the wafer W, and a hydrostatic support stage 90 as a substrate support stage for supporting a second surface 2 of the wafer W which is an opposite side of the wafer W from the first surface 1. The processing head assembly 49 is disposed above the wafer W held by the substrate holder 10, while the hydrostatic support stage 90 is disposed below the wafer W held by the substrate holder 10.

In this embodiment, the first surface 1 of the wafer W is a back surface of the wafer W on which no device is formed or no device is to be formed, i.e., a non-device surface, while the opposite second surface 2 of the wafer W is a surface on which devices are formed or devices are to be formed, i.e., a device surface. In one embodiment, the first surface 1 of the wafer W may be the device surface, while the second surface 2 of the wafer W may be the non-device surface, i.e., the back surface of the wafer W. A silicon surface is one example of the non-device surface. A surface to which photoresist is applied is one example of the device surface. In this embodiment, the wafer W is held by the substrate holder 10 horizontally with the first surface 1 facing upward.

The substrate holder 10 includes a plurality of rollers 11 which can contact a periphery of the wafer W, and a roller-rotating mechanism 12 for rotating the rollers 11 about their respective own axes. In this embodiment, four rollers 11 are provided. Five or more rollers 11 may be provided. In one embodiment, the roller-rotating mechanism 12 includes a motor, a belt, pulleys, etc. The roller-rotating mechanism 12 is configured to rotate the four rollers 11 at the same speed in the same direction. During processing of the first surface 1 of the wafer W, the periphery of the wafer W is held by the rollers 11. The wafer W is held horizontally, and is rotated about its axis by the rotations of the rollers 11.

A rinsing-liquid supply nozzle 27 for supplying a rinsing liquid (e.g. pure water or an alkaline chemical solution) to the first surface 1 of the wafer W is disposed above the wafer W held by the substrate holder 10. The rinsing-liquid supply nozzle 27 is coupled to a not-shown rinsing-liquid supply source. The rinsing-liquid supply nozzle 27 is directed at the center of the wafer W. The rinsing liquid is supplied from the rinsing-liquid supply nozzle 27 to the center of the wafer W, and spreads over the first surface 1 of the wafer W due to the centrifugal force.

The processing head assembly 49 includes a processing head 50 for processing the first surface 1 of the wafer W, held by the substrate holder 10, to remove foreign matter, scratches, etc. from the first surface 1 of the wafer W. The processing head 50 is coupled to a head shaft 51. This head shaft 51 is coupled to a head-rotating mechanism 58 for rotating the processing head 50 about its axis. The head shaft 51 is further coupled to an air cylinder 57 as a load applying device for applying a downward load to the processing head 50. The processing head 50 has a plurality of scrubbing tapes 61 as processing tools for processing the first surface 1 of the wafer W. A lower surface of the processing head 50 is a processing surface constituted by the scrubbing tapes 61. The processing head assembly 49 includes at least the processing head 50, the head shaft 51, the head-rotating mechanism 58, and the air cylinder 57. In one embodiment, the head-rotating mechanism 58 has a known construction comprising a motor, a belt, pulleys, etc.

The hydrostatic support stage 90 is one embodiment of a substrate support stage for supporting the second surface 2 (the opposite side of the wafer W from the first surface 1) of the wafer W held by the rollers 11. In this embodiment, the hydrostatic support stage 90 is configured to bring a fluid into contact with the second surface 2 of the wafer W, held by the rollers 11, so as to support the wafer W with the fluid. The hydrostatic support stage 90 has a substrate support surface 91 to be located close to the second surface 2 of the wafer W held by the rollers 11. Further, the hydrostatic support stage 90 has a plurality of fluid ejection openings 94 formed in the substrate support surface 91, and a fluid supply passage 92 connected to the fluid ejection openings 94. The hydrostatic support stage 90 is disposed under the wafer W held by the substrate holder 10, with the substrate support surface 91 being spaced slightly apart from the second surface 2 of the wafer W. The fluid supply passage 92 is coupled to a not-shown fluid supply source. The substrate support surface 91 of this embodiment has a circular shape, while the substrate support surface 91 may have a square shape or other shape.

The hydrostatic support stage 90 supplies a fluid (e.g. a liquid, such as pure water) to the fluid ejection openings 94 through the fluid supply passage 92 to fill a space between the substrate support surface 91 and the second surface 2 of the wafer W with the fluid. The wafer W is supported by the fluid present between the substrate support surface 91 and the second surface 2 of the wafer W. The wafer W and the hydrostatic support stage 90 are kept out of contact, with a clearance between the wafer W and the hydrostatic support stage 90 being in a range of 50 μm to 500 μm.

The hydrostatic support stage 90 can support the second surface 2 of the wafer W via the fluid in a non-contact manner. Therefore, in a case where devices are formed on the second surface 2 of the wafer W, the hydrostatic support stage 90 can support the wafer W without causing damage to the devices. The fluid for use in the hydrostatic support stage 90 may be a liquid, such as pure water, which is an incompressible fluid, or a gas, such as air or nitrogen gas, which is a compressible fluid. In the case of using pure water, a pure-water supply line, provided in a factory in which the substrate processing apparatus is installed, can be used as the fluid supply source coupled to the fluid supply passage 92.

The lower surface (i.e., the processing surface) of the processing head 50 and the substrate support surface 91 of the hydrostatic support stage 90 are arranged concentrically. Further, the lower surface of the processing head 50 and the substrate support surface 91 of the hydrostatic support stage 90 are disposed symmetrically with respect to the wafer W. Specifically, the lower surface of the processing head 50 and the substrate support surface 91 of the hydrostatic support stage 90 are arranged such that the wafer W is interposed between them. The load applied from the processing head 50 to the wafer W is supported by the hydrostatic support stage 90 located just below the processing head 50. Therefore, the processing head 50 can apply a large load to the first surface 1 of the wafer W without causing warping of the wafer W being supported by the fluid pressure.

The processing head 50 may preferably be disposed such that an edge of the lower surface of the processing head 50 lies on the center of the wafer W. The diameter of the lower surface of the processing head 50 may preferably be equal to or larger than the radius of the wafer W. In this embodiment, the diameter of the substrate support surface 91 is larger than the diameter of the lower surface of the processing head 50. In one embodiment, the diameter of the substrate support surface 91 may be equal to or smaller than the diameter of the lower surface of the processing head 50.

Figure 2:
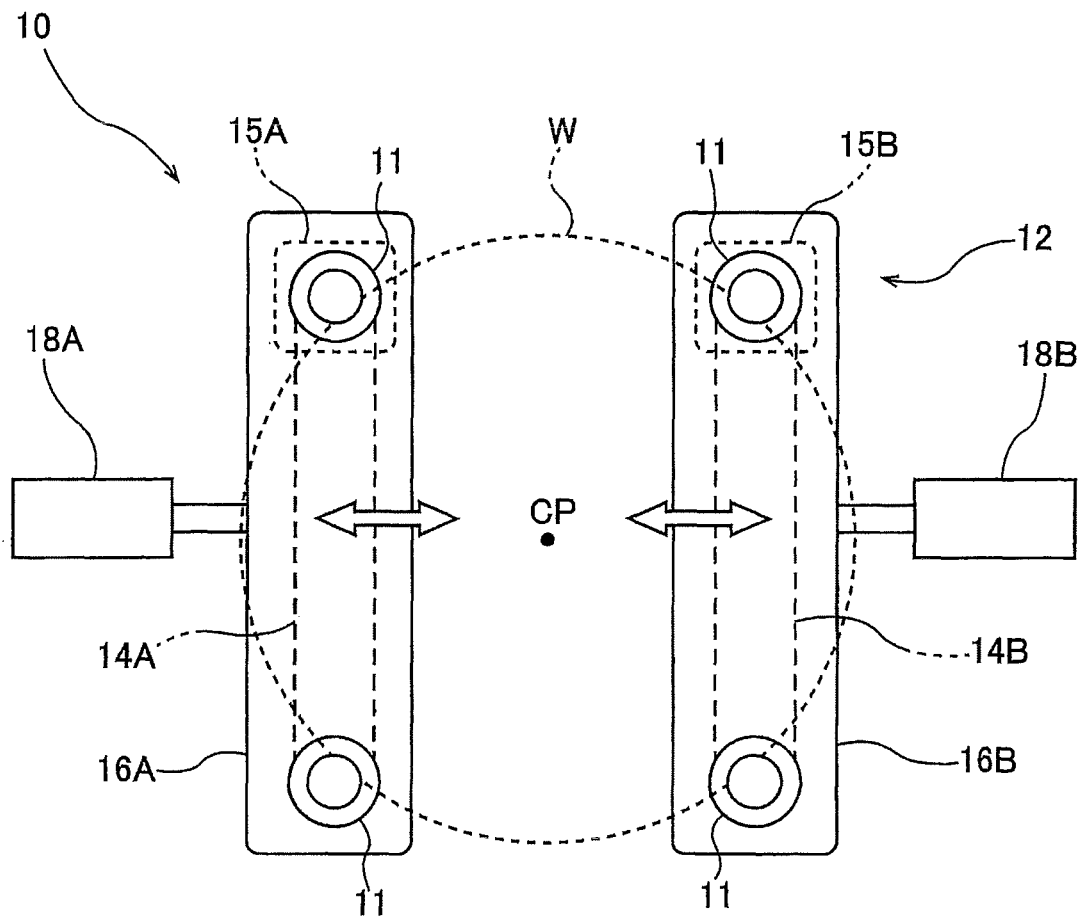
FIG. 2 is a plan view showing details of a roller-rotating mechanism.

FIG. 2 is a plan view showing details of the roller-rotating mechanism 12. The roller-rotating mechanism 12 includes a first belt 14A coupling two of the four rollers 11, a first motor 15A coupled to one of the two rollers 11 coupled by the first belt 14A, a first roller base 16A that rotatably supports the two rollers 11 coupled by the first belt 14A, a second belt 14B coupling the other two of the four rollers 11, a second motor 15B coupled to one of the two rollers 11 coupled by the second belt 14B, and a second roller base 16B that rotatably supports the two rollers 11 coupled by the second belt 14B.

The first motor 15A and the first belt 14A are disposed below the first roller base 16A, and the second motor 15B and the second belt 14B are disposed below the second roller base 16B. The first motor 15A and the second motor 15B are secured to the lower surface of the first roller base 16A and the lower surface of the second roller base 16B, respectively. A not-shown pulley is secured to a lower portion of each of the rollers 11. The first belt 14A rides on pulleys secured to two of the four rollers 11, and the second belt 14B rides on pulleys secured to the other two rollers 11. The first motor 15A and the second motor 15B are configured to rotate at the same speed in the same direction. Therefore, the four rollers 11 can rotate at the same speed in the same direction.

The roller-rotating mechanism 12 further includes a first actuator 18A coupled to the first roller base 16A, and a second actuator 18B coupled to the second roller base 16B. The first actuator 18A is configured to move the two rollers 11, supported by the first roller base 16A, in a horizontal direction as shown by arrow. Similarly, the second actuator 18B is configured to move the other two rollers 11, supported by the second roller base 16B, in a horizontal direction as shown by arrow. Specifically, the first actuator 18A and the second actuator 18B are configured to move the two pairs of rollers 11 (each pair comprising two rollers 11 in this embodiment) in directions closer to and away from each other. The first actuator 18A and the second actuator 18B may each be comprised of an air cylinder, a motor-driven actuator, or the like. In the embodiment shown in FIG. 2, the first actuator 18A and the second actuator 18B are each comprised of an air cylinder. When the two pairs of rollers 11 move closer to each other, the wafer W is held by the four rollers 11. When the two pairs of rollers 11 move away from each other, the wafer W is released from the four rollers 11. In this embodiment, the four rollers 11 are arranged around an axis CP of the substrate holder 10. It is noted that the number of rollers 11 is not limited to four. For example, it is possible to arrange three rollers 11 around the axis CP at regular angular intervals of 120 degrees, and to provide an actuator for each one of the rollers 11.

Figure 3:
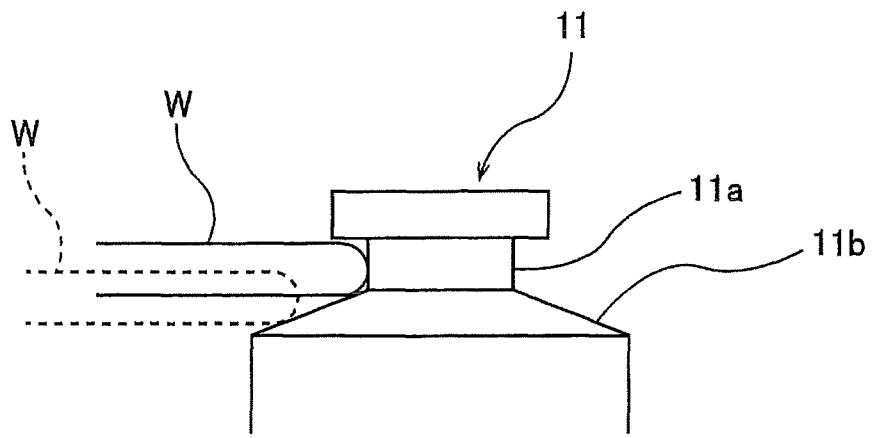
FIG. 3 is an enlarged view of an upper portion of a roller.

FIG. 3 is an enlarged view of an upper portion of the roller 11. Each roller 11 has a cylindrical substrate holding surface 11a that can contact the periphery of the wafer W, and further has a tapered surface 11b connected to the substrate holding surface 11a and inclined downwardly from the substrate holding surface 11a. The tapered surface 11b has a shape of a truncated cone, and has a larger diameter than that of the substrate holding surface 11a. The wafer W is first placed on the tapered surfaces 11b of the rollers 11 by a not-shown transport device. Subsequently, the rollers 11 move toward the wafer W, whereby the periphery of the wafer W is held by the substrate holding surface 11a. When the wafer W is to be released from the rollers 11, the rollers 11 move away from the wafer W, whereby the periphery of the wafer W is separated from the substrate holding surface 11a and is supported on the tapered surfaces 11b (see the dotted line of FIG. 3). The not-shown transport device can remove the wafer W from the tapered surfaces 11b.

Figure 4:
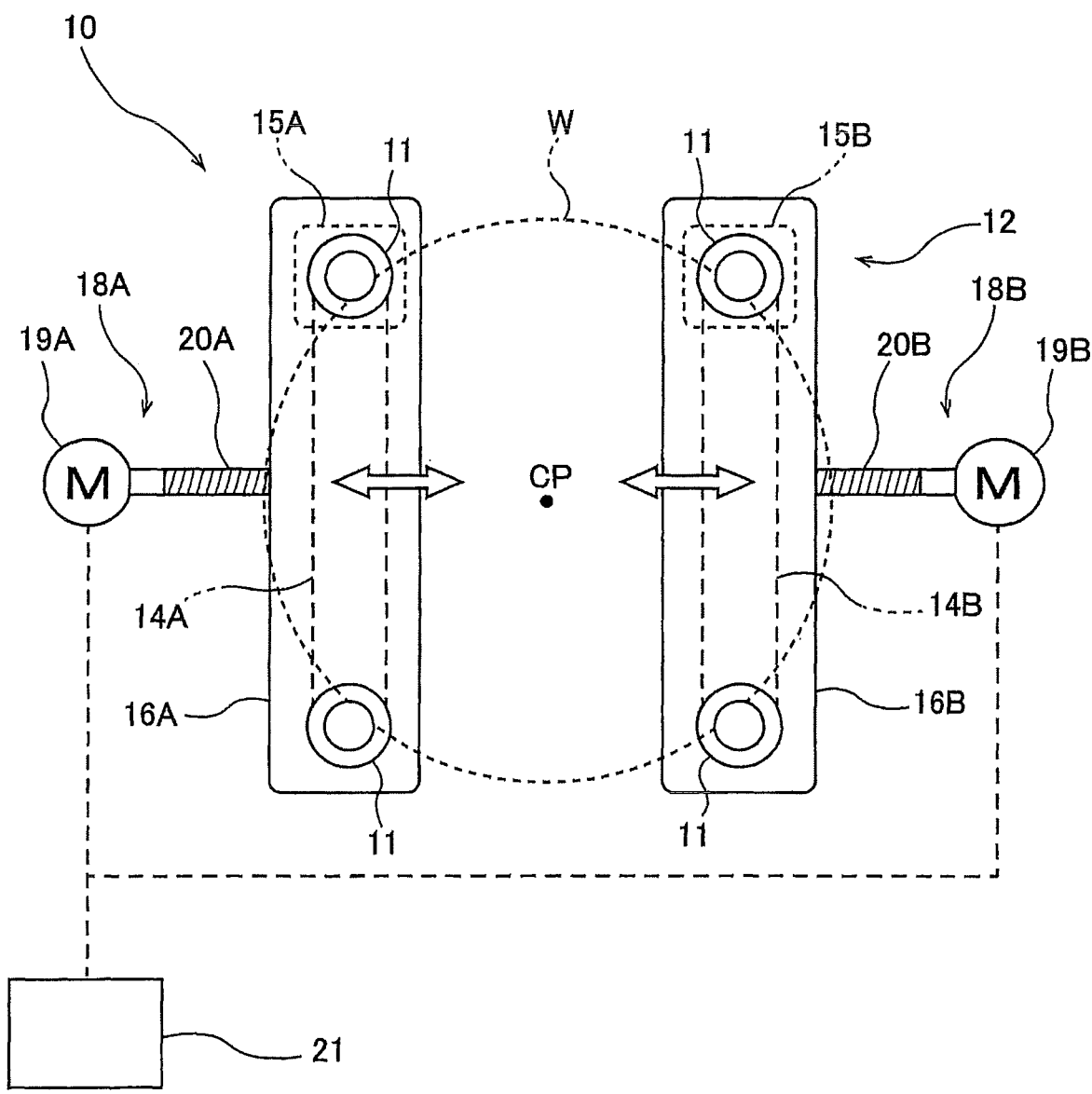
FIG. 4 is a diagram showing an embodiment in which a first actuator and a second actuator are each comprised of a motor-driven actuator.

FIG. 4 is a diagram showing an embodiment in which the first actuator 18A and the second actuator 18B are each comprised of a motor-driven actuator. The first actuator 18A includes a first servo motor 19A, and a first ball screw mechanism 20A coupled to the first roller base 16A. The second actuator 18B includes a second servo motor 19B, and a second ball screw mechanism 20B coupled to the second roller base 16B. The servo motors 19A, 19B are coupled to the ball screw mechanisms 20A, 20B, respectively. When the servo motors 19A, 19B drive the ball screw mechanisms 20A, 20B, the two pairs of rollers 11 move in directions closer to and away from each other.

The servo motors 19A, 19B are electrically connected to an actuator controller 21. By controlling the operations of the servo motors 19A, 19B, the actuator controller 21 can precisely control the positions of the rollers 11 during processing of the wafer W. In this embodiment, the four rollers 11 are arranged around the axis CP of the substrate holder 10; however, the number of rollers 11 is not limited to four. For example, it is possible to arrange three rollers 11 around the axis CP at regular angular intervals of 120 degrees, and to provide an actuator for each one of the rollers 11.

Figure 5:
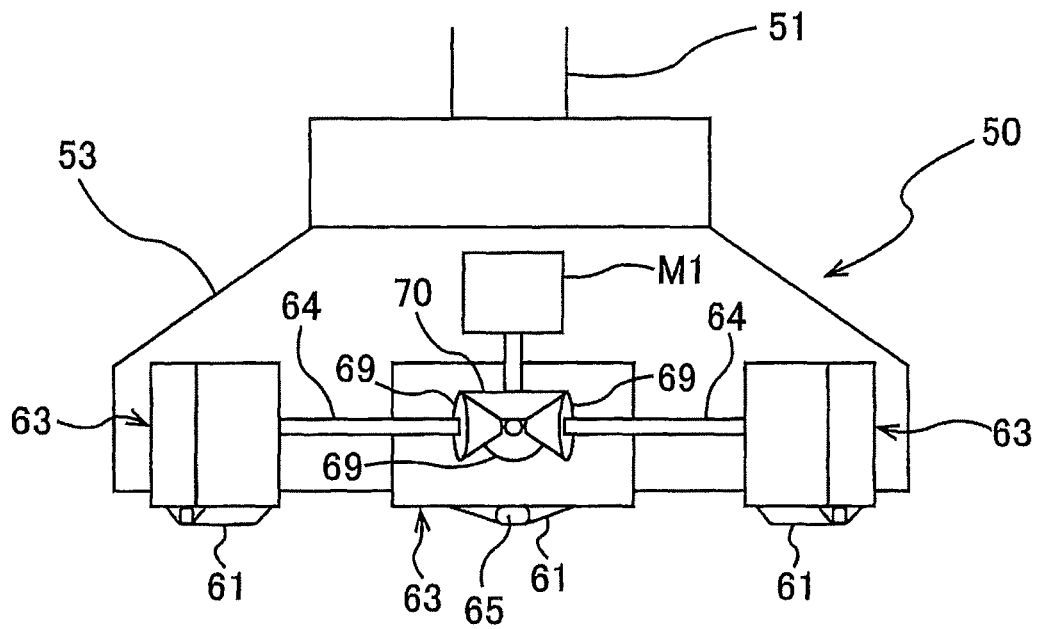
FIG. 5 is a diagram showing an example of an interior structure of the processing head.
Figure 6:
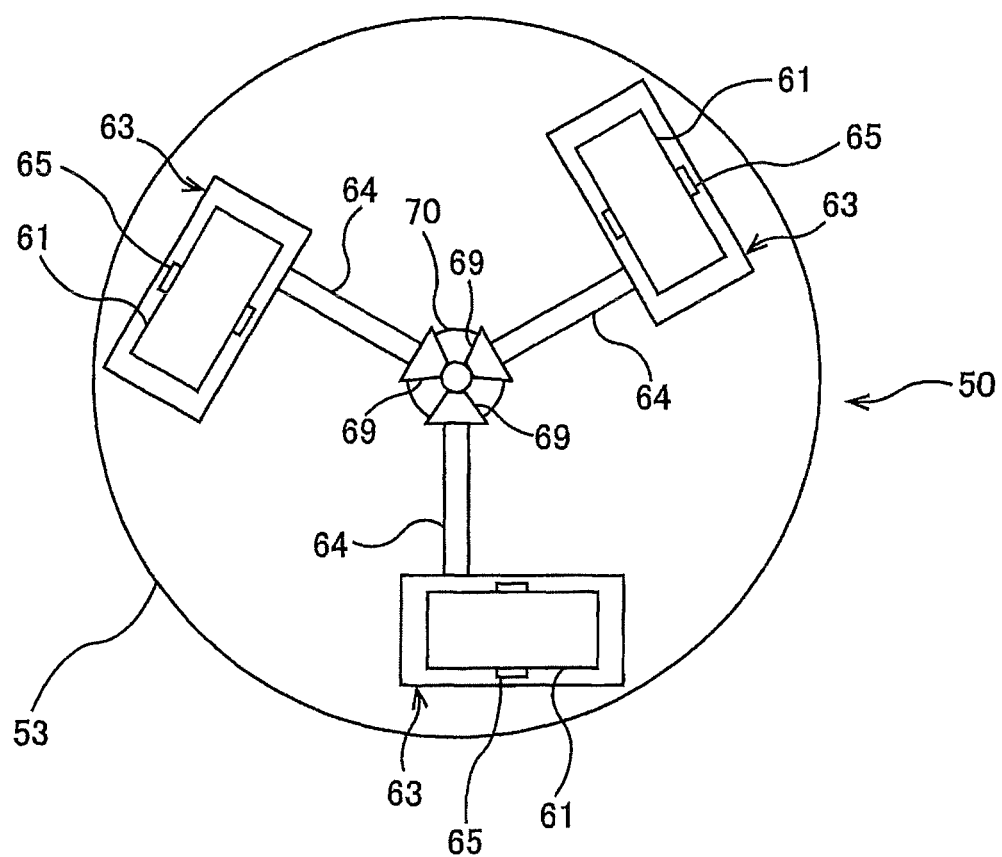
FIG. 6 is a bottom view of the processing head.

FIG. 5 is a view showing an example of an interior structure of the processing head 50, and FIG. 6 is a view of the processing head 50 as seen from below. The processing head 50 includes a housing 53, a plurality of (three in FIG. 5) processing cartridges 63 arranged in the housing 53, a plurality of tape take-up shafts 64 coupled to the processing cartridges 63, respectively, and a motor M1 coupled to the tape take-up shafts 64. The processing cartridges 63 are removably installed inside the housing 53. In one embodiment, the processing head 50 may include four or more processing cartridges 63. One ends of the plurality of tape take-up shafts 64 are coupled to the processing cartridges 63, respectively, and a plurality of bevel gears 69 are fixed to the other ends of the tape take-up shafts 64, respectively. These bevel gears 69 mesh with a bevel gear 70 coupled to the motor M1.

The plurality of processing cartridges 63 include the plurality of scrubbing tapes 61, respectively. These scrubbing tapes 61 are arranged at equal intervals around the axis of the processing head 50. The processing head 50 brings the plurality of scrubbing tapes 61 into contact with the first surface 1 of the wafer W while rotating about the axis of the processing head 50 to thereby process the first surface 1.

Figure 7:
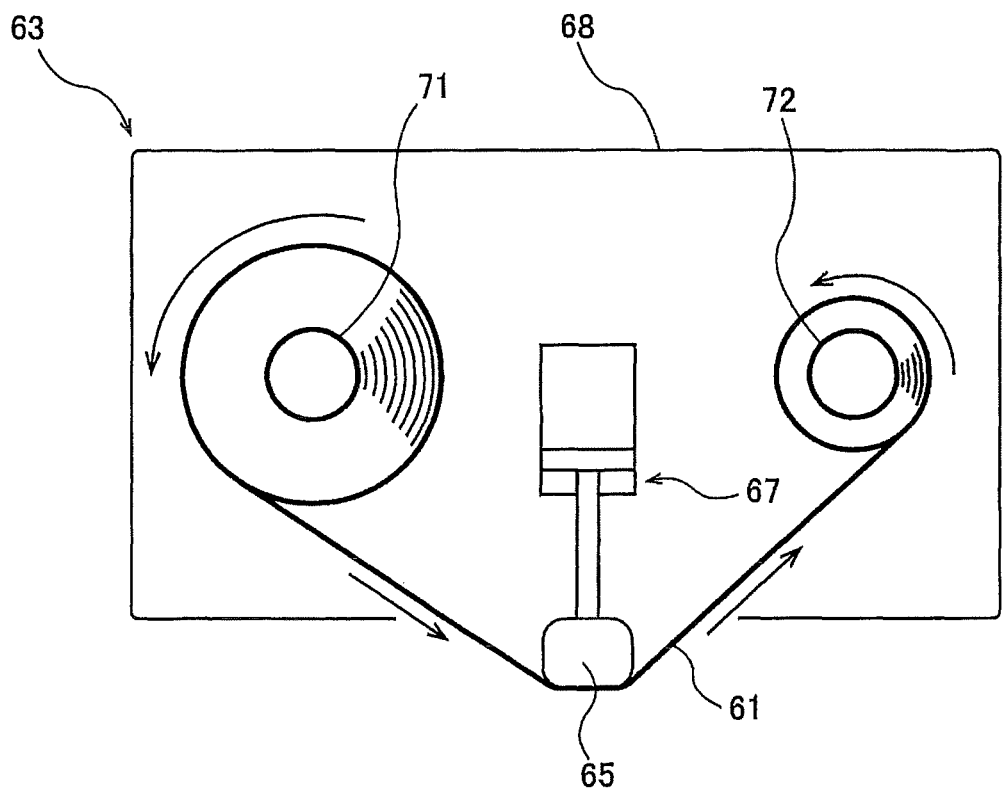
FIG. 7 is a schematic diagram showing one of a plurality of processing cartridges.

FIG. 7 is a schematic diagram showing one of the plurality of processing cartridges 63. As shown in FIG. 7, the processing cartridge 63 includes a pressing member 65 for pressing the scrubbing tape 61 against the first surface 1 of the wafer W, a position switching device 67 configured to be able to switch a position of the pressing member 65 between a processing position and a retreat position, and a cassette 68 accommodating the scrubbing tape 61, the pressing member 65, and the position switching device 67 therein. The position switching device 67 is an actuator for moving the pressing member 65 upwardly and downwardly. In this embodiment, an air cylinder is used as the position switching device 67.

Each of the processing cartridges 63 includes a tape feeding reel 71 for feeding out the scrubbing tape 61 and a tape take-up reel 72 for taking up the scrubbing tape 61 that has been used in processing of the wafer W. The tape feeding reel 71 and the tape take-up reel 72 are disposed in the cassette 68. The tape take-up reel 72 is coupled to one end of the tape take-up shaft 64 shown in FIGS. 5 and 6. Therefore, the tape take-up reel 72 can be driven by the motor M1 shown in FIG. 5 to take up the scrubbing tape 61. The motor M1, the bevel gears 69, 70, and the tape take-up shaft 64 constitute a tape advancing mechanism for advancing the scrubbing tape 61 from the tape feeding reel 71 to the tape take-up reel 72. The scrubbing tape 61 is fed out from the tape feeding reel 71 in a direction of arrow in FIG. 7, passes on a lower surface of the pressing member 65, and is taken up by the tape take-up reel 72. The pressing member 65 presses the scrubbing tape 61 downward to bring the scrubbing tape 61 into contact with the first surface 1 of the wafer W to thereby process the first surface 1.

Figure 8:
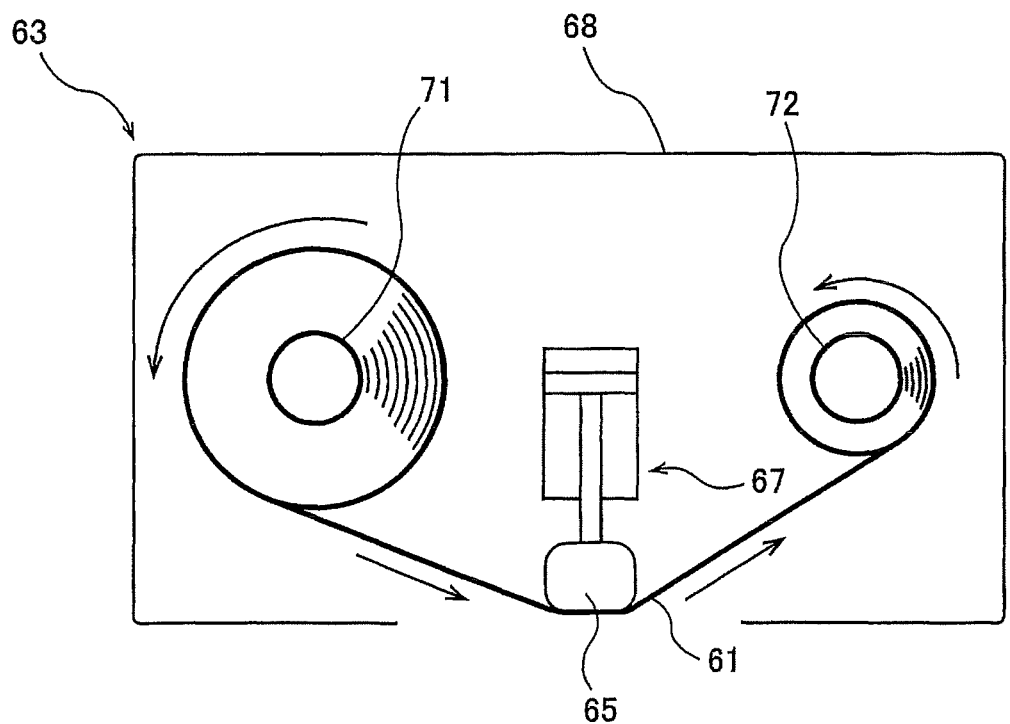
FIG. 8 is a schematic diagram showing a state in which a pressing member and a scrubbing tape are disposed at a retreat position.

FIG. 7 shows a state in which the pressing member 65 and the scrubbing tape 61 are located at the processing position. This processing position is a position at which the scrubbing tape 61 contacts the first surface 1 of the wafer W. FIG. 8 is a schematic diagram showing a state in which the pressing member 65 and the scrubbing tape 61 are located at the retreat position. This retreat position is a position at which the scrubbing tape 61 separates from the first surface 1 of the wafer W. The position switching device 67 can switch the position of the pressing member 65 and the scrubbing tape 61 between the processing position and the retreat position by moving the pressing member 65 between the processing position and the retreat position.

The position switching device 67 can maintain the pressing member 65 and the scrubbing tape 61 at the retreat position. Furthermore, the plurality of position switching devices 67 can operate independently of each other. Therefore, the plurality of position switching devices 67 can bring at least one of the scrubbing tapes 61 into contact with the first surface 1 of the wafer W, while keeping the other scrubbing tape 61 away from the first surface 1 of the wafer W.

Figure 9:
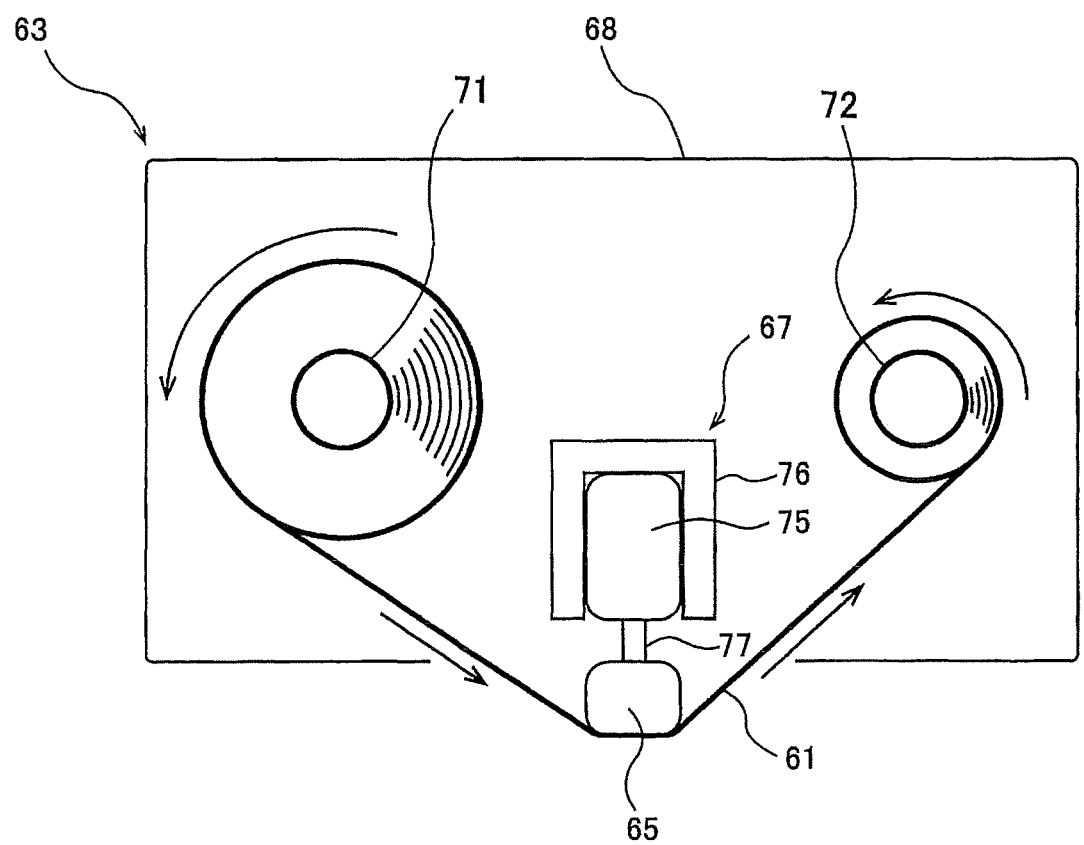
FIG. 9 is a schematic diagram showing another embodiment of a position switching device.

FIG. 9 is a schematic diagram showing another embodiment of the position switching device 67. In the embodiment shown in FIG. 9, the position switching device 67 includes a combination of an air bag 75 and an air-bag holder 76. The air-bag holder 76 is disposed so as to surround the air bag 75. An upper surface of the air bag 75 is fixed to a lower surface of an upper wall of the air-bag holder 76. The air-bag holder 76 is fixed to the cassette 68. The position switching device 67 further includes a holding member 77. An upper end of the holding member 77 is coupled to the air bag 75, and a lower end of the holding member 77 is coupled to the pressing member 65.

FIG. 9 shows a state in which the pressing member 65 and the scrubbing tape 61 are located at the processing position. When a gas is supplied into the air bag 75, the air bag 75 is inflated. The expansion of the air bag 75 in the upward direction and the horizontal direction is limited by the air-bag holder 76. Therefore, the air bag 75 expands downward and pushes down the pressing member 65 to the processing position through the holding member 77. When negative pressure is created in the air bag 75, the pressing member 65 and the scrubbing tape 61 are elevated to the retreat position.

Figure 10:
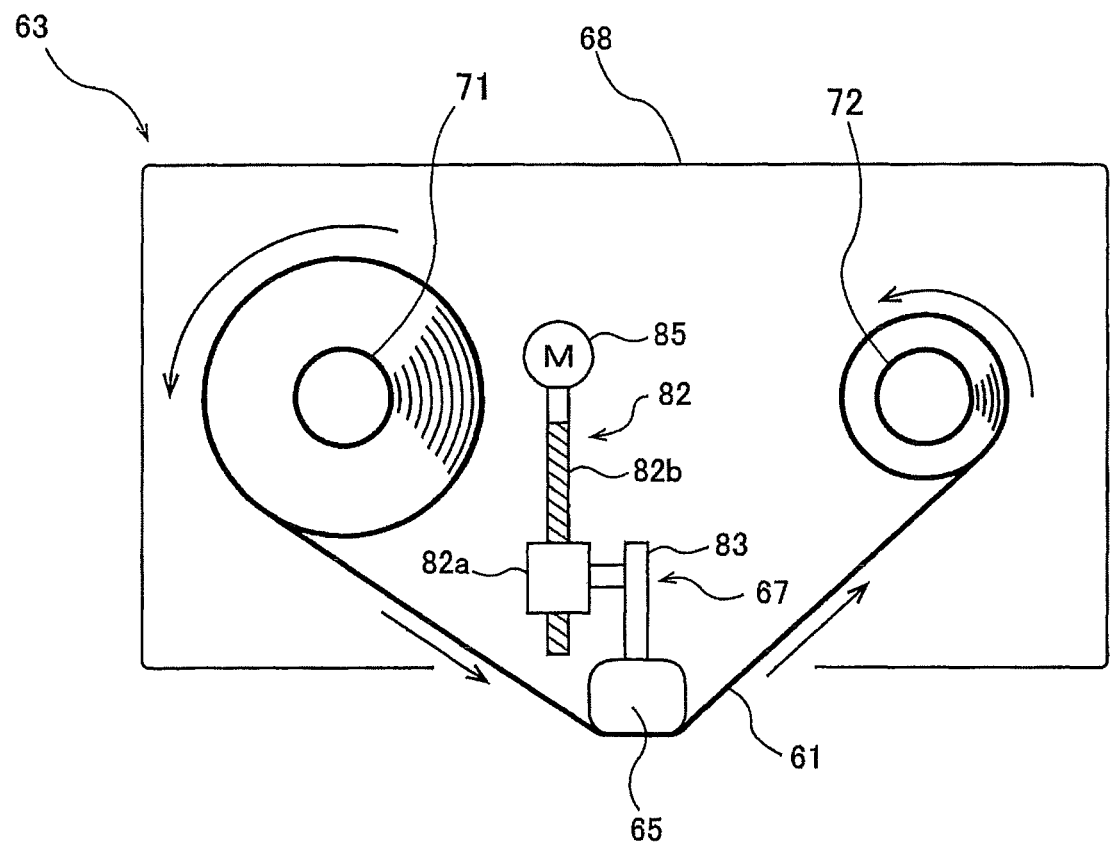
FIG. 10 is a schematic diagram showing still another embodiment of the position switching device.

FIG. 10 is a schematic diagram showing yet another embodiment of the position switching device 67. In the embodiment shown in FIG. 10, the position switching device 67 includes a combination of a motor 85 and a ball screw mechanism 82. FIG. 10 shows a state in which the pressing member 65 and the scrubbing tape 61 are located at the processing position. The ball screw mechanism 82 is composed of a movable element 82a and a screw shaft 82b. The movable element 82a is coupled to the screw shaft 82b of the ball screw mechanism 82. The position switching device 67 further includes a holding member 83. The pressing member 65 is coupled to the movable element 82a through the holding member 83. When the motor 85 is in motion, the movable element 82a of the ball screw mechanism 82 moves upward or downward. As the movable element 82a moves upward or downward, the pressing member 65 is moved between the processing position and the retreat position through the holding member 83. In one embodiment, the motor 85 may be a servomotor electrically connected to a motor controller (not shown).

Each scrubbing tape 61 is a polishing tape having abrasive grains on its surface or a cleaning tape having no abrasive grains. Examples of the polishing tape include a rough polishing tape for rough-polishing the first surface 1 of the wafer W and a finish polishing tape for finish-polishing the first surface 1 of the wafer W. Abrasive grains of the finish polishing tape have smaller size than that of abrasive grains of the rough polishing tape. The cleaning tape is constituted by a member not having abrasive grains and is used to clean the first surface 1 of the wafer W by bringing a surface of the cleaning tape into contact with the first surface 1 of the wafer W. An example of the cleaning tape is a tape made of a nonwoven fabric.

The plurality of scrubbing tapes 61 included in the processing head 50 include different types of scrubbing tapes. For example, the plurality of scrubbing tapes 61 may include a rough polishing tape for performing rough polishing of the wafer W and a finish polishing tape for performing finish polishing of the wafer W. In another example, the plurality of scrubbing tapes 61 may include a polishing tape for polishing the first surface 1 of the wafer W and a cleaning tape for cleaning the first surface 1 of the wafer W. By selectively bringing different types of scrubbing tapes 61 into contact with the first surface 1 of the wafer W, the processing head 50 can perform different processes on the wafer W while the substrate holder 10 is holding the wafer W.

Figure 11:
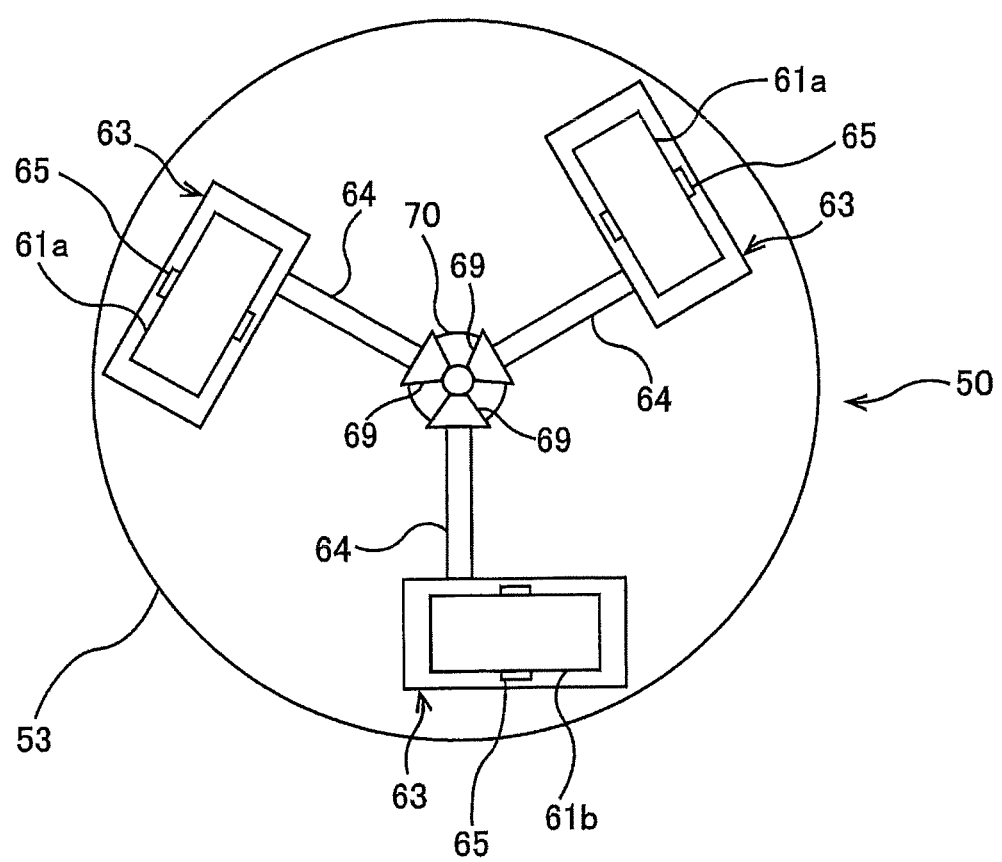
FIG. 11 is a bottom view showing an embodiment of the processing head.

FIG. 11 is a bottom view showing an embodiment of the processing head 50 including two first scrubbing tapes 61*a* and one second scrubbing tape 61*b*. The first scrubbing tapes 61*a* and the second scrubbing tape 61*b* are different types of scrubbing tapes. As shown in FIG. 11, the two first scrubbing tapes 61*a* and the one second scrubbing tape 61*b* are arranged at equal intervals around the axis of the processing head 50.

In one embodiment, the two first scrubbing tapes 61*a* may be rough polishing tapes, and the one second scrubbing tape 61*b* may be a finish polishing tape. Furthermore, in one embodiment, the two first scrubbing tapes 61*a* may be polishing tapes, and the one second scrubbing tape 61*b* may be a cleaning tape. In one embodiment, the processing head 50 may include a first scrubbing tape, a second scrubbing tape, and a third scrubbing tape which are of different types. For example, the processing head 50 may include a rough polishing tape, a finish polishing tape, and a cleaning tape.

In one embodiment, the processing tool may be composed of a fixed processing tool, such as a whetstone, a sponge, or foamed polyurethane, instead of the scrubbing tape 61. In this case, the fixed processing tool is held by a processing-tool holder that holds the fixed processing tool, and the processing-tool holder is coupled to the position switching device 67. The processing head 50 processes the first surface 1 by bringing the fixed processing tool into contact with the first surface 1 of the wafer W. In this specification, a processing tool for polishing the first surface 1 of the wafer W, such as a polishing tape, a whetstone or the like, is defined as a polishing tool, and a processing tool for cleaning the first surface 1 of the wafer W, such as a cleaning tape, a sponge, foamed polyurethane or the like, is defined as a cleaning tool. Examples of the whetstone include a rough whetstone for rough-polishing the first surface 1 of the wafer W, and a finish whetstone for finish-polishing the first surface 1 of the wafer W. Abrasive grains of the finish whetstone have a smaller size than that of the abrasive grains of the rough whetstone. In this specification, a polishing tool for rough-polishing the first surface 1 of the wafer W, such as a rough polishing tape, a rough whetstone or the like, is defined as a rough polishing tool, and a polishing tool for finish-polishing the surface 1 of the wafer W, such as a finish polishing tape, a finish whetstone or the like, is defined as a finish polishing tool.

Figure 12:
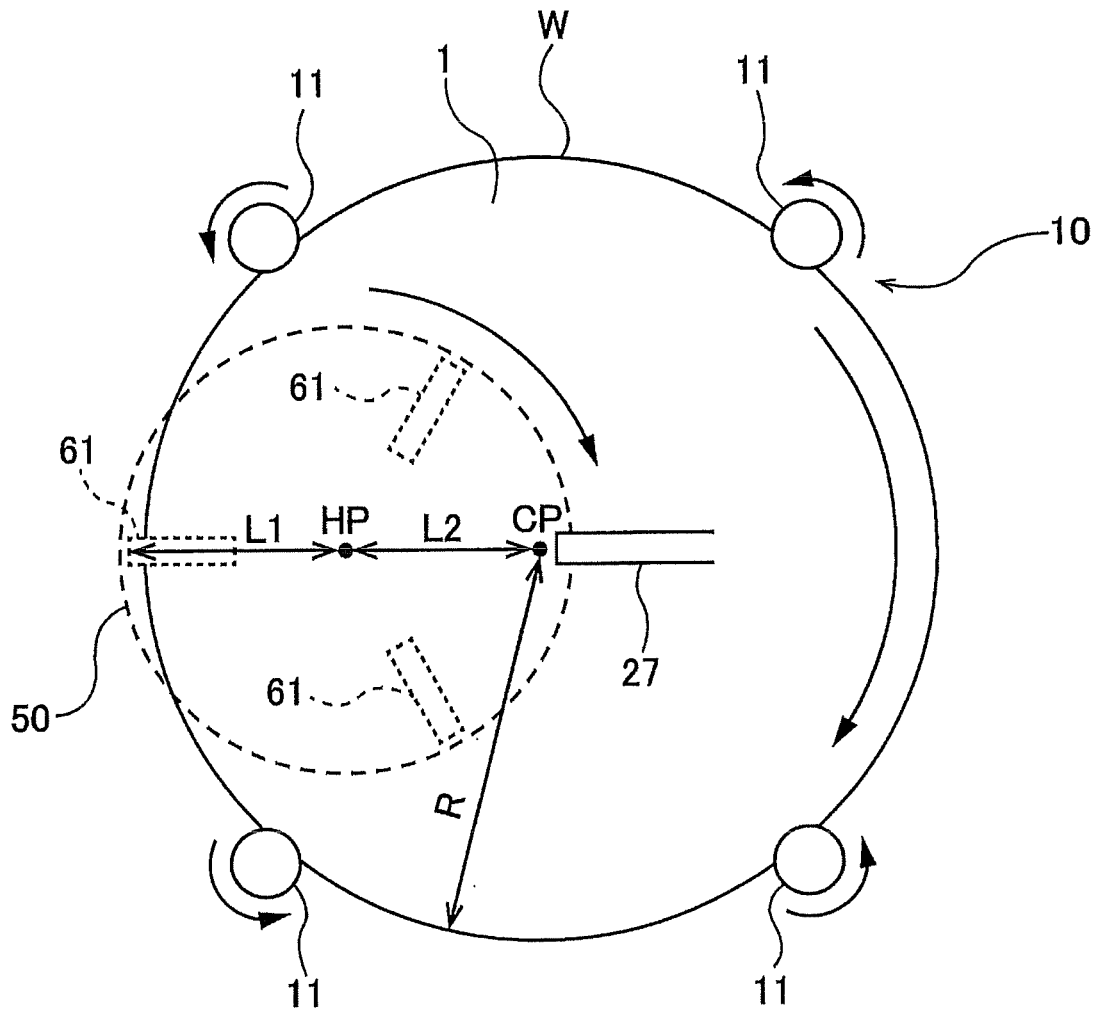
FIG. 12 is a plan view showing an arrangement of the processing head.
Figure 13:
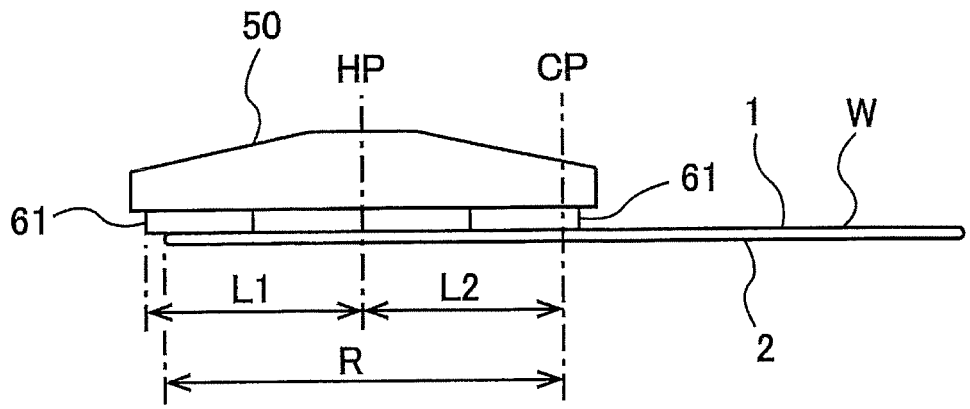
FIG. 13 is a side view showing an arrangement of the processing head.

FIG. 12 is a plan view showing an arrangement of the processing head 50, and FIG. 13 is a side view showing an arrangement of the processing head 50. The plurality of rollers 11 are arranged around the axis CP of the substrate holder 10, and are located at the same distance from the axis CP of the substrate holder 10. When the wafer W is held by the plurality of rollers 11, the central point of the wafer W is on the axis CP of the substrate holder 10.

In this embodiment, the processing head 50 has a diameter larger than the radius R of the wafer W and smaller than the diameter of the wafer W. An axis of the processing head 50 (indicated by symbol HP) is out of alignment with the axis CP of the substrate holder 10. Therefore, the processing head 50 is eccentric with respect to the wafer W held by the substrate holder 10. A distance from the axis HP of the processing head 50 to an outermost edge of a surface (indicated by a dotted line in FIG. 12) of the scrubbing tape 61 that is in contact with the wafer W is L1, and a distance from the axis CP of the substrate holder 10 to the axis HP of the processing head 50 is L2, and the sum of the distance L1 and the distance L2 is longer than the radius R of the wafer W. As a result, as shown in FIGS. 12 and 13, when the processing head 50 is processing the first surface 1 of the wafer W, a part of the surface of the scrubbing tape 61 in contact with the wafer W protrudes from the periphery of the wafer W held by the rollers 11.

As can be seen from FIGS. 12 and 13, when the wafer W is rotating, the scrubbing tape 61 can contact the first surface 1 of the wafer W ranging from the center to the outermost region of the first surface 1. Therefore, the scrubbing tape 61 can process the entirety of the first surface 1 of the wafer W. As a result, it is not necessary to process the outermost region of the surface of the wafer W with an edge processing unit, and the number of processing steps can be reduced. During the processing of the first surface 1 of the wafer W, all the rollers 11 rotate about their respective own axes, while the positions of these rollers 11 are fixed. Therefore, when a part of the scrubbing tape 61 protrudes from the periphery of the wafer W, the rollers 11 do not contact the processing head 50.

Next, operation of the substrate processing apparatus having the processing head 50 described with reference to FIG. 11 will be described. The operation of the substrate processing apparatus described below is controlled by an operation controller 81 shown in FIG. 1. The operation controller 81 is electrically connected to the substrate holder 10, the processing head assembly 49, and the hydrostatic support stage 90. The operations of the substrate holder 10, the rinsing-liquid supply nozzle 27, the processing head assembly 49, and the hydrostatic support stage 90 are controlled by the operation controller 81. The operation controller 81 is composed of a dedicated computer or a general-purpose computer.

The wafer W to be processed is held by the rollers 11 of the substrate holder 10 with the first surface 1 facing upward, and is rotated about the axis of the wafer W. Specifically, the substrate holder 10 rotates the rollers 11 about their own axes while placing the rollers 11 in contact with the periphery of the wafer W with its first surface 1 facing upward, thereby rotating the wafer W. The fluid (e.g., a liquid such as pure water) is supplied to the plurality of fluid ejection openings 94 through the fluid supply passage 92, so that a space between the substrate supporting surface 91 of the hydrostatic support stage 90 and the second surface 2 of the wafer W is filled with the fluid. The wafer W is supported by the fluid flowing in the space between the substrate support surface 91 and the second surface 2 of the wafer W.

Next, the rinsing liquid is supplied from the rinsing-liquid supply nozzle 27 to the first surface 1 of the wafer W. The rinsing liquid that has been supplied to the first surface 1 of the wafer W spreads over the first surface 1 of the wafer W by the centrifugal force. The operation controller 81 instructs the motor M1 to advance the two first scrubbing tapes 61*a* and the one second scrubbing tape 61*b* in their longitudinal directions at a predetermined speed. The head rotating mechanism 58 rotates the processing head 50 about its axis HP in the same direction as the wafer W. Then, the air cylinder 57 pushes the rotating processing head 50 toward the first surface 1 of the wafer W. The processing head 50 presses the two first scrubbing tapes 61*a* or the one second scrubbing tape 61*b* against the first surface 1 of the wafer W in the presence of the rinsing liquid on the first surface 1 of the wafer W to process the entirety of the first surface 1 of the wafer W.

Specifically, first, the position switching devices 67 place the second scrubbing tape 61b at the retreat position, and place the two first scrubbing tapes 61a at the processing positions. The processing head 50 presses the two first scrubbing tapes 61 against the first surface 1 of the wafer W to perform a first process on the entire first surface 1 of the wafer W. After a preset processing time has elapsed, the position switching devices 67 place the two first scrubbing tapes 61a at the retreat positions, while the corresponding position switching device 67 places the second scrubbing tape 61b at the processing position. The processing head 50 presses the second scrubbing tape 61b against the first surface 1 of the wafer W to perform a second process on the entire first surface 1 of the wafer W. After a preset time has elapsed, the operation controller 81 instructs the position switching device 67 to move the second scrubbing tape 61b to the retreat position. The operation controller 81 then stops the operations of the substrate holder 10, the rinsing-liquid supply nozzle 27, the processing head assembly 49, and the hydrostatic support stage 90, thereby terminating the processing of the wafer W.

In the present embodiment, the two first scrubbing tapes 61a are rough polishing tapes having abrasive grains on their surfaces. The process of pressing the two first scrubbing tapes 61a against the first surface 1 of the wafer W to perform the first process on the entirety of the first surface 1 of the wafer W is a process of pressing the two rough polishing tapes against the first surface 1 of the wafer W to rough-polish the entirety of the first surface 1 of the wafer W. The second scrubbing tape 61b is a finish polishing tape having abrasive grains on its surface. The process of pressing the second scrubbing tape 61b against the first surface 1 of the wafer W to perform the second process on the entirety of the first surface 1 of the wafer W is a process of pressing the finish polishing tape against the first surface 1 of the wafer W to finish-polish the entirety of the first surface 1 of the wafer W. In one embodiment, a rough whetstone may be used instead of the first scrubbing tape 61a, and a finish whetstone may be used instead of the second scrubbing tape 61b.

The finish-polishing of the first surface 1 of the wafer W is performed after the rough-polishing of the entire first surface 1 of the wafer W. Specifically, after the rough-polishing of the entire first surface 1 of the wafer W, the rough polishing tool is moved from the processing position to the retreat position, and the finish polishing tool is moved from the retreat position to the processing position. The finish polishing tool is then pressed against the first surface 1 of W to finish-polish the entire first surface 1 of the wafer W.

In one embodiment, the two first scrubbing tapes 61a are polishing tapes having abrasive grains on their surfaces. The process of pressing the two first scrubbing tapes 61a against the first surface 1 of the wafer W to perform the first process on the entirety of the first surface 1 of the wafer W is a process of pressing the two polishing tapes against the first surface 1 of the wafer W to polish the entirety of the first surface 1 of the wafer W. The second scrubbing tape 61b is a cleaning tape having no abrasive grains. The process of pressing the second scrubbing tape 61b against the first surface 1 of the wafer W to perform the second process on the entirety of the first surface 1 of the wafer W is a process of pressing the cleaning tape against the first surface 1 of the wafer W to clean the entirety of the first surface 1 of the wafer W. Furthermore, in one embodiment, the processing tool may be a whetstone, such as a rough whetstone or a finish whetstone, instead of the first scrubbing tape 61a. A sponge or foamed polyurethane may be used in place of the second scrubbing tape 61b.

The cleaning of the first surface 1 of the wafer W is performed after the polishing of the entire first surface 1 of the wafer W. Specifically, after the polishing of the entire first surface 1 of the wafer W with the polishing tool, the polishing tool is moved from the processing position to the retreat position, and the cleaning tool is moved from the retreat position to the processing position. The cleaning tool is then pressed against the first surface 1 of the wafer W to thereby clean the entirety of the first surface 1 of the wafer W.

Figure 14:
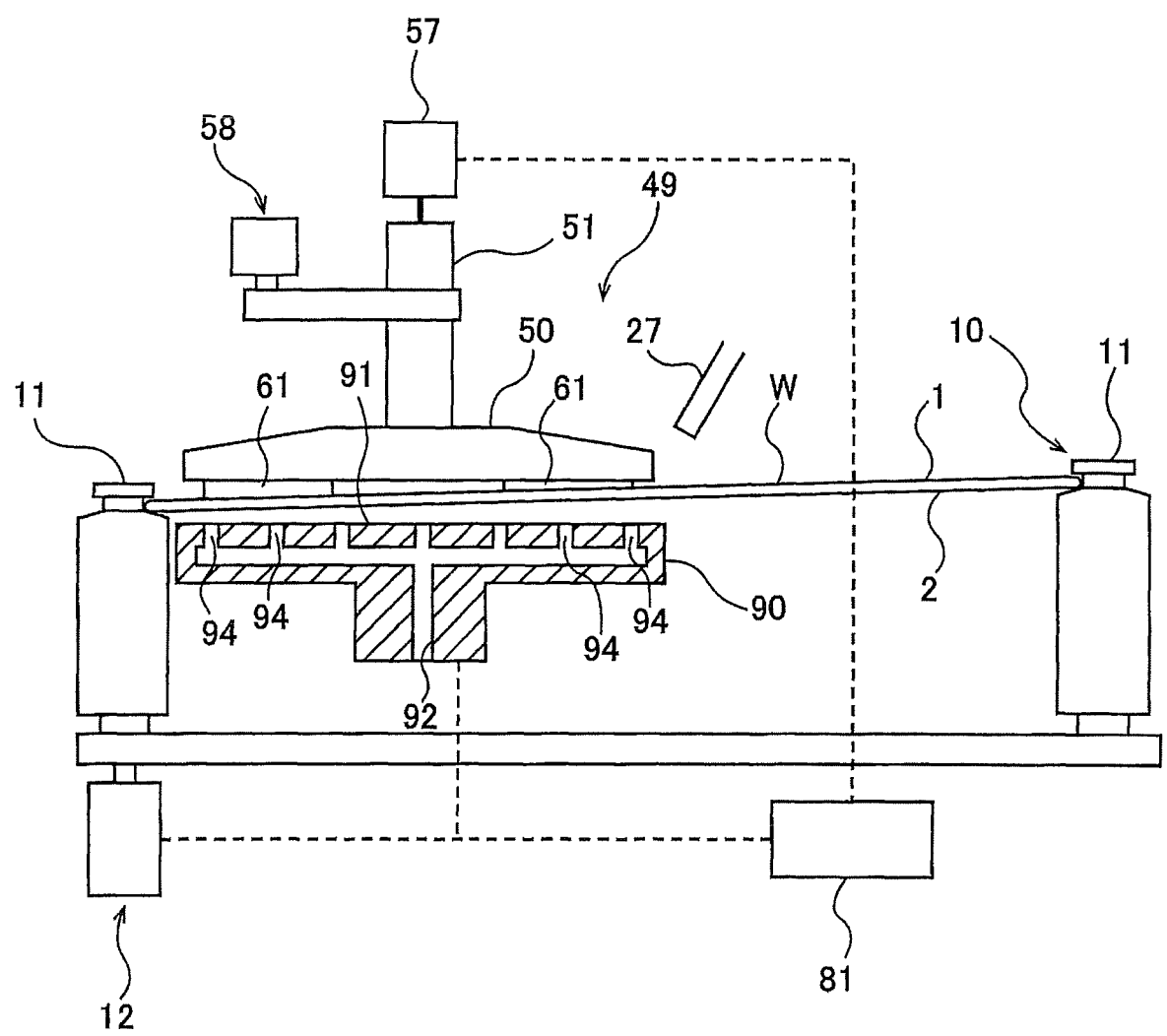
FIG. 14 is a schematic diagram showing another embodiment of the substrate processing apparatus.

FIG. 14 is a schematic diagram showing another embodiment of the substrate processing apparatus. Configurations of the present embodiment, which will not be described particularly, are the same as those of the embodiments described with reference to FIGS. 1 to 13, and duplicate explanations will be omitted. At least one of the substrate holding surfaces 11a of the rollers 11 of this embodiment is different in height from the substrate holding surfaces 11a of the other rollers 11. According to the present embodiment, the substrate holder 10 holds the wafer W in a tilted state. The wafer W may have a surface condition different from that in other region within the entire surface of the wafer W. For example, the entire wafer W may be warped, or a distribution of foreign matters present on the surface of the wafer W may be uneven within the surface of the wafer W. In such cases, in order to uniformly process the entire surface of the wafer W, it is necessary to change a processing rate according to the surface condition of the wafer W.

In this embodiment, there is a difference in load applied from the processing head 50 to the wafer W between a center-side region and a peripheral-side region of the wafer W. In this embodiment, the load applied to the center-side region of the wafer W is larger than the load applied to the peripheral-side region of the wafer W. As a result, the substrate processing apparatus of this embodiment can increase the processing rate at the center-side region of the wafer W, and can lower the processing rate at the peripheral-side region of the wafer W. In one embodiment, at least one of the substrate holding surfaces 11a of the rollers 11 located at the side of the processing head 50 may be higher than the substrate holding surfaces 11a of the rollers 11 located at the opposite side across the processing head 50. In this case, the substrate processing apparatus can lower the processing rate at the center-side region of the wafer W, and can increase the processing rate at the peripheral-side region of the wafer W.

Figure 15:
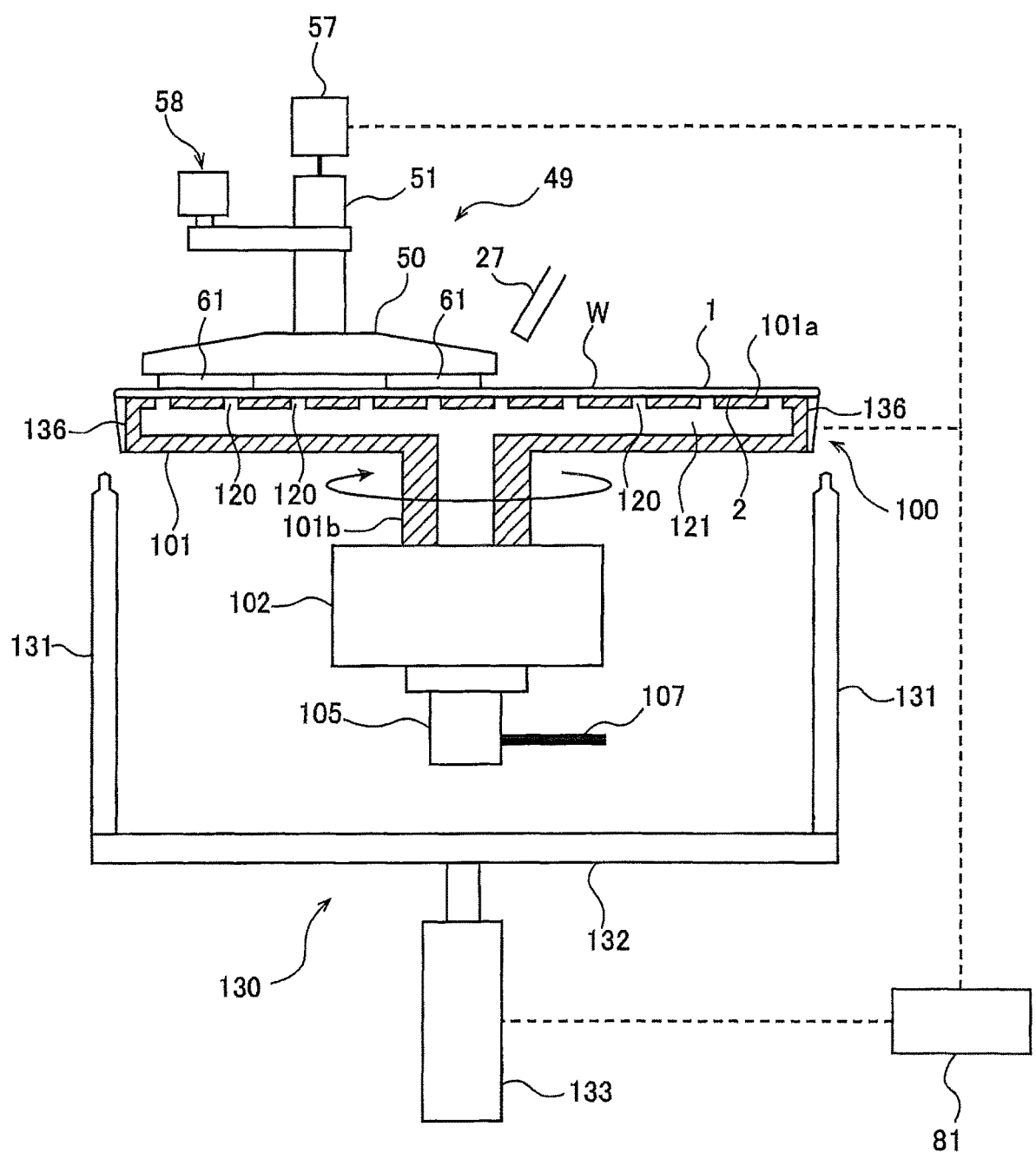
FIG. 15 is a schematic diagram showing still another embodiment of the substrate processing apparatus.

FIG. 15 is a schematic diagram showing still another embodiment of the substrate processing apparatus. Configurations and operations of the present embodiment, which will not be described particularly, are the same as those of the embodiment described with reference to FIGS. 1 to 13, and duplicate explanations will be omitted. The substrate processing apparatus shown in FIG. 15 includes, instead of the substrate holder 10, a substrate holder 100 that holds the second surface 2 of the wafer W and rotates the wafer W about the axis of the wafer W, and further includes lifting mechanism 130 for lifting the substrate W. The operation controller 81 is electrically connected to the substrate holder 100 and the lifting mechanism 130. Operations of the substrate holder 100 and the lifting mechanism 130 are controlled by the operation controller 81. In the present embodiment, the first surface 1 of the wafer W is a surface on which a device is formed or a device is to be formed, i.e., a device surface, and the opposite second surface 2 of the wafer W is the back surface of the wafer W on which no device is formed or no device is to be formed, i.e., a non-device surface.

The substrate holder 100 includes a vacuum suction stage 101 for holding the second surface 2 of the wafer. W by vacuum suction, a stage motor 102 for rotating the vacuum suction stage 101, a rotary joint 105 coupled to the vacuum suction stage 101, and a vacuum line 107 coupled to the rotary joint 105. In the present embodiment, the stage motor 102 is a hollow motor. A shaft portion 101b of the vacuum suction stage 101 extends in the stage motor 102, and is coupled to the rotary joint 105. In one embodiment, the stage motor 102 may be disposed beside the shaft portion 101b of the vacuum suction stage 101 and may be coupled to the shaft portion 101b of the vacuum suction stage 101 by a transmission mechanism, such as a belt.

The vacuum suction stage 101 includes a holding surface 101a for holding the second surface 2 of the wafer W, a plurality of suction holes 120 which open in the holding surface 101a, and an internal chamber 121 communicating with these suction holes 120. The internal chamber 121 communicates with the rotary joint 105. The vacuum line 107 communicates with the suction holes 120 through the rotary joint 105 and the internal chamber 121. When the vacuum line 107 produces a vacuum (negative pressure) in the suction holes 120, the second surface 2 of the wafer W is attracted to the holding surface 101a. In this embodiment, the wafer W and the holding surface 101a are circular. The holding surface 101a has substantially the same diameter as the wafer W. Therefore, the entire second surface 2 of the wafer W (including the central region and the peripheral region of the second surface 2 of the wafer W) is supported by the holding surface 101a. The wafer W is horizontally held by the vacuum suction stage 101, and is rotated about the axis of the vacuum suction stage 101 (which coincides with the axis of the wafer W) by the stage motor 102.

The lifting mechanism 130 includes a plurality of lift pins 131 for supporting an edge portion of the wafer W, a bridge 132 coupling these lift pins 131 to each other, and an elevating device 133 coupled to the bridge 132. In this embodiment, four lift pins 131 are arranged, and an air cylinder is used for the elevating device 133. The elevating device 133 is configured to be able to raise and lower the bridge 132 and the lift pins 131 relative to the vacuum suction stage 101. More specifically, the elevating device 133 is configured to move the lift pins 131 vertically between an elevated position at which upper ends of the lift pins 131 are located higher than the holding surface 101a of the vacuum suction stage 101 and a lowered position at which the upper end of the lift pins 131 is lower than the holding surface 101a of the vacuum suction stage 101. FIG. 15 shows a state in which the plurality of lift pins 131 are in the lowered position. When the first surface 1 of the wafer W is processed, the plurality of lift pins 131 are at the lowered position. Therefore, even if a part of the scrubbing tape 61 protrudes from the periphery of the wafer W, the plurality of lift pins 131 do not contact the processing head 50. Also in this embodiment, when the wafer W is rotating, the scrubbing tape 61 can come into contact with the first surface 1 of the wafer W ranging from the center to the outermost region of the first surface 1. Therefore, the scrubbing tape 61 can process the entire first surface 1 of the wafer W.

Figure 16:
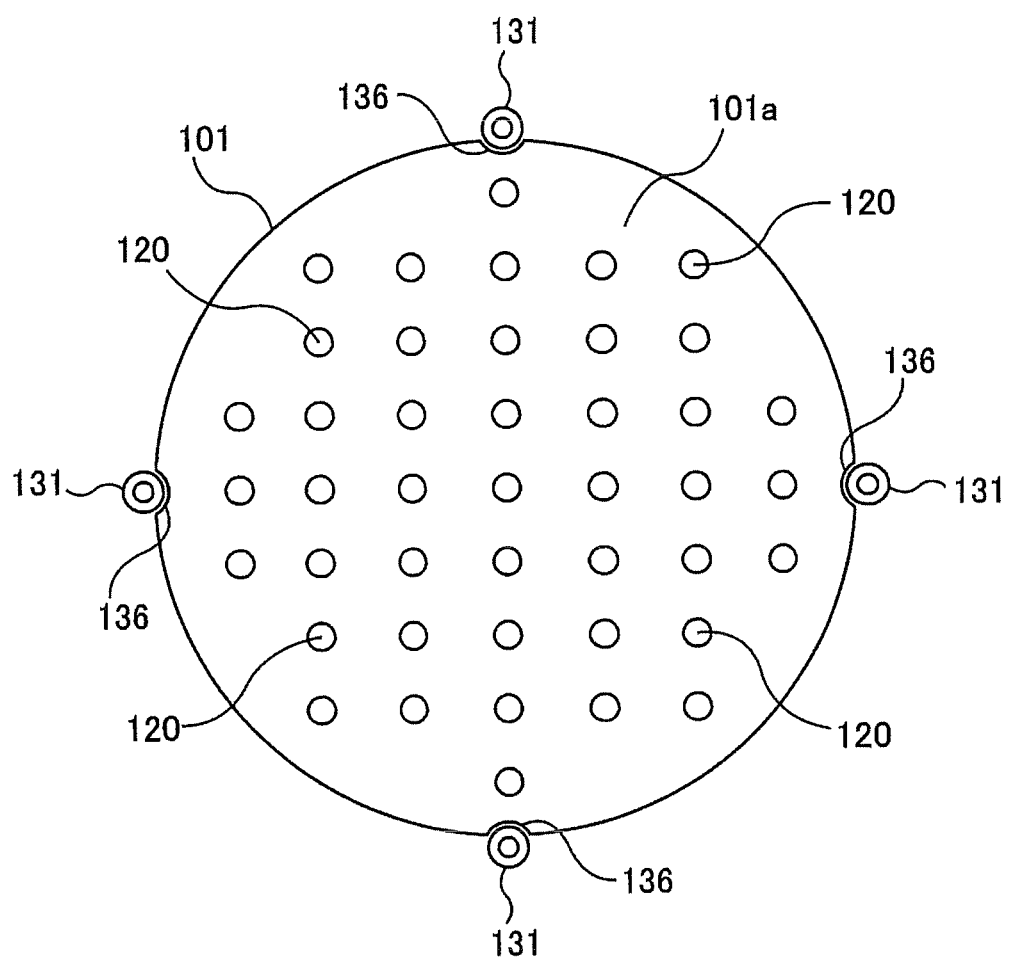
FIG. 16 is a plan view showing a vacuum suction stage and a plurality of lift pins.

FIG. 16 is a plan view showing the vacuum suction stage 101 and the lift pins 131. As shown in FIG. 16, recesses 136 are formed in a periphery of the vacuum suction stage 101 for allowing the lift pins 131 to pass through the recesses 136, respectively. In this embodiment, each recess 136 has a horizontal-cross section in a form of a semicircle that is shaped along a circumferential surface of the lift pin 131. When the lift pins 131 are at the elevated position, the wafer W is placed onto the lift pins 131 by a transfer device (not shown). At this time, the processing head 50 has already been moved to a retreat position outside the vacuum suction stage 101. When the lift pins 131 are lowered to a position lower than the holding surface 101a of the vacuum suction stage 101, the wafer W is placed on the holding surface 101a. After processing of the wafer W is terminated, the wafer W is lifted from the holding surface 101a by the lift pins 131. When the processing head 50 is at the retreat position and the lift pins 131 are at the elevated position, the wafer W is removed from the lift pins 131 by the transfer device.

In the substrate processing apparatus according to the various embodiments described above, when the wafer W is rotating, the scrubbing tape 61 can contact the first surface 1 of the wafer W ranging from the center to the outermost region of the surface 1. Therefore, the scrubbing tape 61 can process the entire first surface 1 of the wafer W. In addition, the plurality of scrubbing tapes 61 of the processing head 50 include different types of scrubbing tapes 61, and each scrubbing tape 61 can be switched between the processing position and the retreat position by the position switching device 67. Therefore, the substrate processing apparatus can perform different processes, such as polishing and cleaning, on the entire first surface 1 of the wafer W with one processing head 50. As a result, a time of a series of processes, such as polishing and cleaning, can be shortened, and the first surface 1 of the wafer W can be processed efficiently. In an example, processing (e.g., polishing or cleaning) of the entire back surface of the wafer W is carried out after applying a photoresist to a surface of the wafer W and before an exposure of the wafer W coated with the photoresist.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate processing apparatus comprising:
a substrate holder configured to hold a substrate and rotate the substrate; and
a processing head configured to bring scrubbing tapes into contact with a first surface of the substrate to process the first surface,
wherein the processing head includes:
pressing members arranged to press the scrubbing tapes against the first surface of the substrate;
position switching devices configured to be able to switch positions of the pressing members between processing positions and retreat positions;
tape feeding reels configured to feed the scrubbing tapes, respectively; and
tape take-up reels configured to take up the scrubbing tapes, respectively,
wherein each of the scrubbing tapes comprises one of a rough polishing tape having abrasive grains on a surface thereof, a finish polishing tape having abrasive grains on a surface thereof, and a cleaning tape having no abrasive grains.

2. The substrate processing apparatus according to claim 1, wherein the position switching devices comprise actuators configured to move the pressing members, respectively.

3. The substrate processing apparatus according to claim 1, wherein the substrate holder includes:
a vacuum suction stage configured to attract a second surface of the substrate by vacuum suction to hold the second surface, the second surface being an opposite side of the substrate from the first surface; and
a stage motor configured to rotate the vacuum suction stage.

4. The substrate processing apparatus according to claim 1, wherein the substrate holder includes rollers arranged to be able to contact a periphery of the substrate, the rollers being rotatable about their own axes.

5. The substrate processing apparatus according to claim 4, wherein the substrate holder further includes a hydrostatic support stage configured to support a second surface of the substrate, the second surface being an opposite side of the substrate from the first surface.

6. The substrate processing apparatus according to claim 4, wherein:
the rollers have substrate holding surfaces, respectively, which can contact the periphery of the substrate; and
at least one of the substrate holding surfaces is different in height from other substrate holding surfaces.

7. A substrate processing method comprising:
rotating a substrate while holding the substrate with a substrate holder; and
pressing a first scrubbing tape or a second scrubbing tape by a processing head against a first surface of the substrate to process an entirety of the first surface, the processing head having the first scrubbing tape and the second scrubbing tape,
wherein processing the entirety of the first surface of the substrate comprises:
placing the second scrubbing tape at a retreat position and placing the first scrubbing tape at a processing position;
pressing the first scrubbing tape against the first surface of the substrate to perform a first process on the entirety of the first surface of the substrate;
placing the first scrubbing tape at a retreat position and placing the second scrubbing tape at a processing position; and
pressing the second scrubbing tape against the first surface of the substrate to perform a second process on the entirety of the first surface of the substrate
wherein: the first scrubbing tape comprises a polishing tape having abrasive grains on a surface thereof;
pressing the first scrubbing tape against the first surface of the substrate to perform the first process on the entirety of the first surface of the substrate comprises
pressing the polishing tape against the first surface of the substrate to polish the entirety of the first surface of the substrate;
the second scrubbing tape comprises a cleaning tape having no abrasive grains; and
pressing the second scrubbing tape against the first surface of the substrate to perform the second process on the entirety of the first surface of the substrate comprises
pressing the cleaning tape against the first surface of the substrate to clean the entirety of the first surface of the substrate.

8. The substrate processing method according to claim 7, wherein:
the first scrubbing tape comprises a rough polishing tape having abrasive grains on a surface thereof;
pressing the first scrubbing tape against the first surface of the substrate to perform the first process on the entirety of the first surface of the substrate comprises
pressing the rough polishing tape against the first surface of the substrate to rough-polish the entirety of the first surface of the substrate;
a third scrubbing tape comprises a finish polishing tape having abrasive grains on a surface thereof; and
pressing the third scrubbing tape against the first surface of the substrate to perform a third process on the entirety of the first surface of the substrate comprises
pressing the finish polishing tape against the first surface of the substrate to finish-polish the entirety of the first surface of the substrate.

9. A substrate processing method comprising:
rotating a substrate by rotating rollers about their own axes while placing the rollers in contact with a periphery of the substrate; and
pressing a rough polishing tool, a finish polishing tool, or a cleaning tool by a processing head against a back surface of the substrate to process an entirety of the back surface, the
processing head having the rough polishing tool, the finish polishing tool, and the cleaning tool, wherein processing the entirety of the back surface of the substrate comprises:
placing the finish polishing tool at a retreat position and placing the rough polishing tool at a processing position;
pressing the rough polishing tool against the back surface of the substrate to rough-polish the entirety of the back surface of the substrate;
placing the rough polishing tool at a retreat position and placing the finish polishing tool at a processing position; and
pressing the finish polishing tool against the back surface of the substrate to finish-polish the entirety of the back surface of the substrate;
wherein the rough polishing tool comprises a rough polishing tape having abrasive grains on a surface thereof, and the finish polishing tool comprises a finish polishing tape having abrasive grains on a surface thereof, and the cleaning tool comprises a cleaning tape having no abrasive grains.

10. The substrate processing method according to claim 9, wherein the polishing of the entirety of the back surface of the substrate is performed after a photoresist has been applied to a surface of the substrate and before an exposure is performed on the substrate with the photoresist applied.

11. The substrate processing method according to claim 9, wherein finish-polishing the entirety of the back surface of the substrate comprises:
moving the rough polishing tool from a processing position to a retreat position and moving the finish polishing tool from a retreat position to a processing position after the entirety of the back surface of the substrate is rough-polished; and
pressing the finish polishing tool against the back surface of the substrate to finish-polish the entirety of the back surface of the substrate.

12. A substrate processing method comprising:
rotating a substrate by rotating rollers about their own axes while placing the rollers in contact with a periphery of the substrate; and
pressing a polishing tool or a cleaning tool by a processing head against a back surface of the substrate to process an entirety of the back surface, the processing head having the polishing tool and the cleaning tool, wherein processing the entirety of the back surface of the substrate comprises:
placing the cleaning tool at a retreat position and placing the polishing tool at a processing position;
pressing the polishing tool against the back surface of the substrate to polish the entirety of the back surface of the substrate;
placing the polishing tool at a retreat position and placing the cleaning tool at a processing position; and
pressing the cleaning tool against the back surface of the substrate to clean the entirety of the back surface of the substrate;
wherein the polishing tool comprises a polishing tape having abrasive grains on a surface thereof, and the cleaning tool comprises a cleaning tape having no abrasive grains.

13. The substrate processing method according to claim 12, wherein the processing of the entirety of the back surface of the substrate is performed after a photoresist has been applied to a surface of the substrate and before an exposure is performed on the substrate with the photoresist applied.

14. The substrate processing method according to claim 12, wherein cleaning the entirety of the back surface of the substrate comprises:
moving the polishing tool from a processing position to a retreat position and moving the cleaning tool from a retreat position to a processing position after the entirety of the back surface of the substrate is polished; and
pressing the cleaning tool against the back surface of the substrate to clean the entirety of the back surface of the substrate.

* * * * *